United States Patent [19]

Takahasi

[11] Patent Number: 5,247,425
[45] Date of Patent: Sep. 21, 1993

[54] SEMICONDUCTOR DEVICE
[75] Inventor: Yoshikazu Takahasi, Matsumoto, Japan
[73] Assignee: Fuji Electric Co., Ltd., Kawasaki, Japan
[21] Appl. No.: 943,922
[22] Filed: Sep. 11, 1992
[30] Foreign Application Priority Data
 Sep. 13, 1991 [JP] Japan .................. 3-233503
[51] Int. Cl.⁵ .............................. H05K 7/20
[52] U.S. Cl. ..................... 361/717; 165/80.3; 165/185; 257/718; 257/726; 257/727; 361/383; 361/388; 361/690; 361/707; 174/16.3
[58] Field of Search ................ 165/80.3, 185; 174/16.3; 257/712-714, 718-720, 727; 361/382, 383, 385-389

[56] References Cited

U.S. PATENT DOCUMENTS 3,401,317  9/1968  Gault .
3,717,797  2/1973  Rydeski .................. 257/727
3,864,607  2/1975  Phillips .................. 361/383
3,993,123  11/1976  Chu et al. .
4,769,744  9/1988  Neugebauer et al. ........ 361/386

FOREIGN PATENT DOCUMENTS 0006445  1/1980  European Pat. Off. .
255812   5/1985  France .
63-226952  3/1987  Japan .

Primary Examiner—Gregory D. Thompson
Attorney, Agent, or Firm—Brumbaugh, Graves, Donohue & Raymond

[57] ABSTRACT

A container type semiconductor device containing many semiconductor elements is provided. The device allows heat to be dissipated from both sides of each semiconductor element by placing metal contact plates against the emitter electrodes of each semiconductor element. The metal contact plates are held firmly in place by spring means which also make contact with inner face of a terminal which is exposed outside the container. Heat flows from each semiconductor element through the spring means to the external terminal where the heat is dissipated. In one embodiment, the spring means are used also as a path for the flow of current to the terminal. Because wiring is not used, inductance is low making the device suitable for high frequency applications.

20 Claims, 2 Drawing Sheets

SEMICONDUCTOR DEVICE

BACKGROUND OF THE INVENTION

The present invention relates to a semiconductor device in which a plurality of semiconductor elements are accommodated in one container wherein the emitter and collector electrodes of each element are connected to terminals drawn from the container. Typically, such devices utilize insulated gate-type bipolar transistors (IGBT).

Previously, in such devices where the semiconductor elements were to be connected in parallel, the collector electrodes located on the bottom of each chip could be connected together simply by affixing the bottom of each chip to an electrically conductive substrate. Connecting the emitter electrodes together required the use of aluminum wires to bond each emitter electrode to a terminal to be drawn from the device. The number of wires needed depended on the intended current carrying capacity of the device, with larger currents requiring a greater number of wires.

Recently there has been demand for IGBT semiconductor devices with larger current carrying capacities. It is important that these devices be compact and have low inductance. Increasing a device's current carrying capacity generally requires that more IGBT elements be integrated in the device. Additionally, in the conventional design heat is dissipated readily through the collector electrode connections but not through the emitter electrode wire interconnections. These factors will increase the size of the device, and necessarily increases the number of aluminum wires to facilitate the emitter electrode interconnections. As a result, the wire inductance will increase and thereby limit the usage of the device in high frequency applications.

An object of the present invention is to provide a semiconductor device which is capable of increased current carrying capacity while reducing the number of semiconductor elements contained therein. This is accomplished by improving the device's heat dissipation characteristics by providing an alternative to the conventional use of bonded wires to make the emitter connections. In the present invention, heat dissipation is not limited to the collector side, but takes place through both the collector and the emitter sides of each IGBT element, even where the device has an increased current carrying capacity. The present invention also provides a device suitable for use in high frequency applications since internal inductance is kept to a minimum due to the lack of wiring.

A semiconductor device according to the present invention has a construction such that a plurality of semiconductor elements are accommodated in one container. Each semiconductor element includes a substrate with an emitter electrode disposed on one side and a collector electrode disposed on the other, opposing side. The emitter electrode of each semiconductor element makes contact with an associated metal contact plate, of which there is at least one metal contact plate for each semiconductor element. The metal contact plates have a thermal expansion coefficient that approximates that of the semiconductor material. Spring means having good thermal conductivity are present between the metal contact plates and the top wall of the container to urge the metal contact plates into firm engagement with the emitter electrodes. The top wall of the container comprises a first terminal, with one face interior to the container and the other face exterior to the container.

Another objective of the present invention is to provide a semiconductor device which also includes a plurality of supporting plates having a coefficient of thermal expansion approximating that of the semiconductor elements. A supporting plate is disposed between the collector electrode of each semiconductor element and the bottom wall of the container.

Another objective of the present invention is to provide a semiconductor device in which the spring means are electrically conductive in addition to being heat conductive, such that an electrical connection is established between the top wall of the container and the metal contact plate.

Another objective of the present invention is to provide a semiconductor device in which each of the metal contact plates is electrically connected to the top wall of the container via an electrically conductive connector plate. Also provided is spring means which include at least one compression spring and an intermediate plate formed of an electrically insulating material exhibiting good heat conductivity disposed between the compression springs and the connector plate. In this structure, heat is conducted through the metal contact plates, the connection plates and the intermediate plates and the compression spring means to the top wall of the container where it is dissipated.

Another object of the present invention is to provide a semiconductor device in which the space in the container, not occupied by the aforementioned elements is filled with a heat-conductive gel material.

Another object of the present invention is to provide a semiconductor device in which the semiconductor elements comprise IGBT's.

Another object of the present invention is to provide a semiconductor device in which the metal contact plates are made of molybdenum (Mo).

Another object of the present invention is to provide a semiconductor device in which the supporting plates are made of molybdenum (Mo).

The effect of the present invention is that heat is conducted from the semiconductor elements via the contact plates and the spring means to the top wall of the container where it is dissipated from the exterior face of the device. Because the heat is dissipated, each semiconductor element will have increased current carrying capacity. Moreover, because electric current is conducted from each semiconductor element through the metal contact plates to the terminal directly or conducted from the metal plates to an intermediate plate to the terminal, there is no longer any need to use bonded aluminum wire connections. Thus the inductance problems caused by the aluminum wires are minimized, making the device suitable for high frequency applications. Heat dissipation can further be improved by filling the remaining space in the container with a heat conductive gel.

DESCRIPTION OF THE PREFERRED EMBODIMENT

The embodiments of the present invention are explained hereunder with reference to the drawings.

Figure 1:
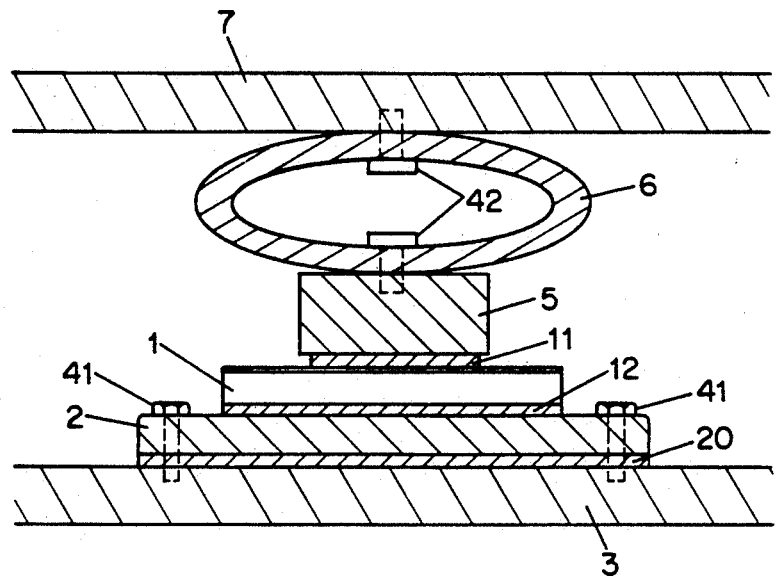
FIG. 1 is a partial cross section of an IGBT module according to one embodiment of the present invention.
Figure 2:
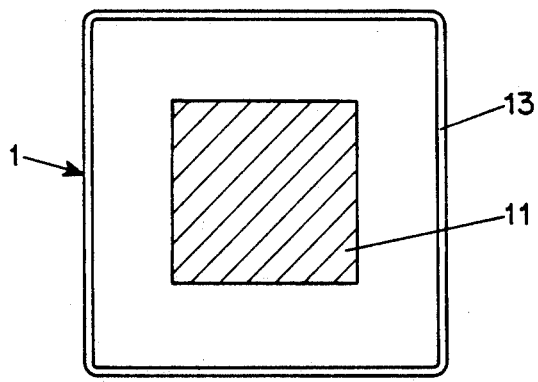
FIG. 2 is a plan view of an IGBT chip.

A first preferred embodiment is shown in FIG. 1 and has a construction in which the elements that permit heat dissipation also serve as paths for conduction of electric current. On the top surface of a silicon IGBT semiconductor element 1, shown in the figure, an emitter power-collecting electrode 11 is disposed so that it covers the gate structure as shown in the plan view of FIG. 2. A collector electrode 12 is disposed beneath the IGBT chip. An edge 13 is formed around the circumference of the IGBT chip 1 to ensure that the chip can withstand excessive voltages. The collector electrode 12 is brazed or fused to a supporting plate 2 made of molybdenum (Mo). The Mo supporting plate 2 has nearly the same thermal expansion coefficient as a plate made of silicon and is fitted to the bottom wall of the container via an intervening plate 20. Screws 41 are employed to maintain the fit, but brazing may also be used. The bottom wall of the container is made of copper and constitutes a collector terminal plate 3, the other face of which is exposed to the outside. A contact plate 5 also made of molybdenum (Mo) is shown and is in contact with the surface of the emitter power-collecting electrode 11. A ring-shaped spring 6 is disposed between the Mo contact plate 5 and the top wall of the container. The top wall of the container constitutes an emitter terminal plate 7 one side of which is exposed to the outside. The spring is made of steel having a thickness of about 2 mm, and exhibits good electrical and heat conductivity. Screws 42 are used to affix the spring to the Mo contact plate 5 and the emitter terminal plate 7. In this embodiment the installment of the emitter power-collecting electrode 11, the Mo contact plate 5 and the spring 6 between the IGBT chip 1 and the emitter terminal plate 7 creates a path which facilitates both heat conduction and electrical conduction from the IGBT chip to the emitter terminal plate 7 constituting the outside of the container. The placement of the spring in this construction acts to urge the Mo metal contact plate 5 into firm engagement with the emitter power-collecting electrode 11 which in turn urges the IGBT chip into firm engagement with the Mo supporting plate 2. The Mo contact plate 5 may also be fused onto the emitter electrode 11, which in this example is made of aluminum (Al). This enhances the reliability of the device by ensuring that the IGBT chip 1 is properly connected to the Mo contact plate 5 and the Mo supporting plate 2. Although not shown, the IGBT chip has a gate electrode which is connected by conventional aluminum wire bonding to a gate terminal drawn from the device.

Figure 3:
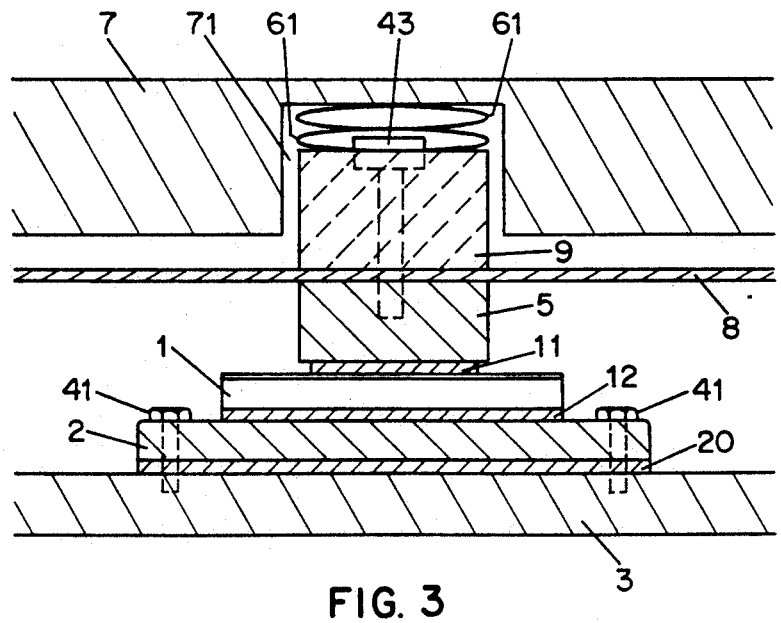
FIG. 3 is a partial cross section of an IGBT module according to a different embodiment of the present invention.
Figure 4:
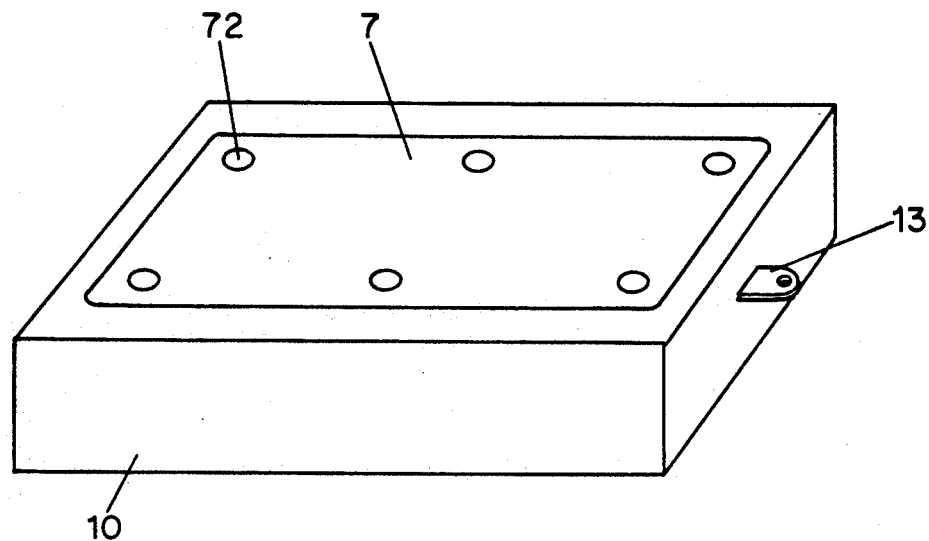
FIG. 4 is a perspective outline drawing of an IGBT module according to an embodiment of the present invention.
Figure 5:
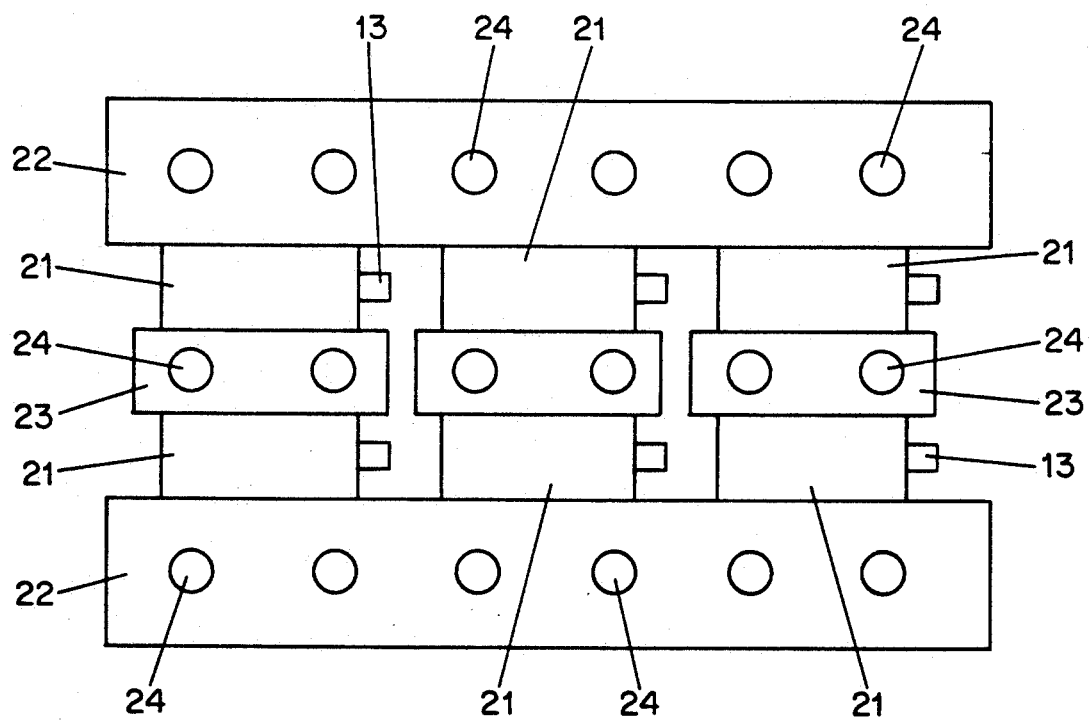
FIG. 5 is a side view of an inverter stack using IGBT modules according to an embodiment of the present invention.

A second preferred embodiment is shown in FIG. 3. Parts appearing in FIG. 1 are given the same reference numerals. FIG. 3 shows a construction in which the path for dissipation of heat and the path for flow of electric current are independent of each other. In this case, an Al$_2$O$_3$ (alumina) intermediate plate 9 is fixed on to a Mo contact plate 5 by a screw 43. Alumina is an insulator that is high in heat conductivity. A copper (Cu) connector plate 8 having a thickness of about 1 mm is held between the alumina intermediate plate 9 and the Mo contact plate 5, and a compression spring 61, which has good heat conductivity. In this example, there are two springs, both made of silver (Ag) inserted between the alumina intermediate plate 9 and the emitter terminal plate 7. Although not shown in the figure, the Cu connector plate 8 is bent and screwed down or brazed onto the terminal plate 7 to facilitate electric current flow. Heat dissipation takes place through the path consisting of the emitter power-collecting electrode 11, the Mo contact plate 5, the Cu connector plate 8, the alumina intermediate plate 9, and the spring 61. Electric current flow takes place through the path consisting of the emitter power-collecting electrode 11, the Mo contact plate 5 and the Cu connector plate 8 and the emitter terminal plate 7. The spring 61 and part of the alumina intermediate plate 9 are housed in a recess 71 in the emitter terminal plate 7. This helps to keep the container height as low as possible and enhances heat dissipation by allowing heat to propagate from the alumina intermediate plate 9 to the inner face of the recess part 71 through the clearance. As shown in FIGS. 1 and 3, an IGBT module has been constructed which has a volume about half of that of conventional modules and which allows the module to be cooled from both emitter and collector sides. The dissipation of heat toward the emitter terminal 7 side further can be improved by the introduction of a gel with a high heat conductivity, such as a gel resin containing alumina, into the space within the recess. FIG. 4 shows the appearance of the IGBT module as illustrated in FIGS. 1 and 3. The emitter terminal plate 7 is exposed on the top of the container. The closed container is surrounded by insulating side walls 10, with the gate terminal 13 protruding from one of the side walls. The emitter terminal 7 has been drilled with holes to permit the use of cooling bodies 72. FIG. 5 illustrates the construction of the present invention using IGBT semiconductor elements to form a three-phase inverter stack. Six IGBT modules 21 are sandwiched between two cooling bodies 22 in three parts, each consisting of two modules, via three intermediate cooling bodies 23. The cooling bodies 22 and 23 are drilled with holes 24 to allow insertion of heat pipes or to allow cooling water to flow. Here the low-inductance modules are assembled so that the cooling bodies are in contact with the terminal plates on both sides of the module and serve also as electrical connectors. Thus, the inverter stack also has a low inductance on the whole, and is compact. Although the above embodiments were explained with reference to IGBT semiconductor elements, other semiconductor elements may readily be used.

I claim:
1. A semiconductor device providing improved heat dissipation, comprising:
   a closed container having opposed top and bottom walls, said top and bottom walls formed of electrically conductive material, said top and bottom walls comprising first and second external terminals, respectively, for said device;
   a plurality of semiconductor elements disposed within said container, each of said elements having emitter and collector electrodes formed on opposed surfaces thereof;

a like plurality of supporting plates, one of which is disposed between the collector electrode of each of said semiconductor elements and the bottom wall of said container and all of which are electrically connected to said bottom wall;

a like plurality of contact plates formed of a metal having a coefficient of thermal expansion approximating that of said semiconductor elements, one of which is disposed between the emitter electrode of each of said semiconductor elements and the top wall of said container, each of said contact plates being in direct electrical contact with a respective emitter electrode and all of which are electrically connected to said top wall; and a like plurality of spring means, one associated with each of said semiconductor elements and all engaging said top wall, each of said spring means including compression spring means, each of said spring means for urging a respective contact plate into firm engagement with the emitter electrode of a respective semiconductor element, said compression spring means being formed of a material having a good heat conductivity;

whereby heat is conducted from said semiconductor elements via said contact plates and said spring means to the top wall of said container for dissipation exteriorly of said container.

2. A semiconductor device as defined in claim 1 wherein said supporting plates are formed of a metal with a thermal expansion coefficient approximating that of said semiconductor elements.

3. A semiconductor device as defined in claim 1, wherein each of said spring means includes a compression spring formed of a material exhibiting good electrical conductivity in addition to good heat conductivity and provides electrical connection between a respective contact plate and the top wall of said container.

4. A semiconductor device as defined in claim 3 wherein said supporting plates are formed of a metal with a thermal expansion coefficient approximating that of said semiconductor elements.

5. A semiconductor device as defined in claim 3, wherein said compression spring comprises a ring shaped spring.

6. A semiconductor device as defined in claim 1, wherein each of said contact plates is electrically connected to the top wall of said container via a connector plate formed of conductive material, and wherein each of said spring means includes at least one compression spring formed of a material exhibiting good electrical conductivity in addition to good heat conductivity and further includes an intermediate plate formed of an electrically insulating material exhibiting good heat conductivity disposed between said compression spring and said connector plate, whereby heat is conducted from said semiconductor elements via said contact plates, said connector plate, said intermediate plates and said compression spring to the top wall of said container.

7. A semiconductor device as defined in claim 6 wherein said supporting plates are formed of a metal with a thermal expansion coefficient approximating that of said semiconductor elements.

8. A semiconductor device as defined in claim 6, wherein said connector plate is a thin sheet of copper sandwiched between said contact plates and said intermediate plates and electrically connected to the top wall of said container, and wherein said intermediate plate is formed of alumina.

9. The semiconductor device as defined in claim 1, wherein said contact plates are formed of molybdenum.

10. The semiconductor device as defined in claim 3, wherein said contact plates are formed of molybdenum.

11. The semiconductor device as defined in claim 6, wherein said contact plates are formed of molybdenum.

12. The semiconductor device as defined in claim 9, wherein said supporting plates are formed of molybdenum.

13. The semiconductor device as defined in claim 10, wherein said supporting plates are formed of molybdenm 14. The semiconductor device as defined in claim 11, wherein said supporting plates are formed of molybdenum.

15. The semiconductor device as defined in claim 1, wherein said semiconductor elements comprise IGBT's.

16. The semiconductor device as defined in claim 3, wherein said semiconductor elements comprise IGBT's.

17. The semiconductor device as defined in claim 5, wherein said semiconductor elements comprise IGBT's.

18. The semiconductor device as defined in claim 1, wherein said top wall includes a recess filled with heat conductive gel.

19. The semiconductor device as defined in claim 3, wherein said top wall includes a recess filled with heat conductive gel.

20. The semiconductor device as defined in claim 6, where said top wall includes a recess filled with heat conductive gel.

* * * * *